(12) United States Patent
Younger et al.

(10) Patent No.: US 8,766,707 B1
(45) Date of Patent: Jul. 1, 2014

(54) INTEGRATED ALWAYS ON POWER ISLAND FOR LOW POWER MODE OPERATION

(71) Applicant: Seagate Technology LLC, Cupertino, CA (US)

(72) Inventors: Scott Thomas Younger, Shakopee, MN (US); Jon David Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/844,479

(22) Filed: Mar. 15, 2013

(51) Int. Cl.
*H03K 3/01* (2006.01)

(52) U.S. Cl.
USPC .......................................... 327/534; 327/544

(58) Field of Classification Search
CPC .............................. G06F 1/3234; G06F 1/3287
USPC ................... 327/530, 534, 535, 538, 540, 544
See application file for complete search history.

(56) References Cited

U.S. PATENT DOCUMENTS

| | | | |
|---|---|---|---|
| 5,544,138 A | 8/1996 | Bajorek et al. |
| 5,920,726 A | 7/1999 | Anderson |
| 6,401,193 B1 | 6/2002 | Afsar et al. |
| 6,720,673 B2 | 4/2004 | Blanco et al. |
| 6,795,876 B1 | 9/2004 | Solomon |
| 7,017,078 B2 | 3/2006 | Frimout |
| 7,181,565 B2 | 2/2007 | Surico et al. |
| 7,191,327 B2 | 3/2007 | Viljoen et al. |
| 7,254,732 B2 | 8/2007 | Bashford et al. |
| 7,295,462 B2 | 11/2007 | Farnworth |
| 7,380,059 B2 | 5/2008 | Burton |
| 7,436,206 B2 * | 10/2008 | Kurotsu .......................... 326/34 |
| 7,506,335 B1 | 3/2009 | Wooff et al. |
| 7,539,048 B2 | 5/2009 | Farnworth |
| 7,542,091 B2 | 6/2009 | Bean et al. |
| 7,797,525 B2 | 9/2010 | Lee et al. |
| 7,873,059 B2 | 1/2011 | Morita et al. |
| 7,904,604 B2 | 3/2011 | Lum et al. |
| 7,911,840 B2 | 3/2011 | Wu et al. |
| 7,930,485 B2 | 4/2011 | Fertig et al. |
| 7,937,602 B2 | 5/2011 | Elliott et al. |
| 7,941,682 B2 | 5/2011 | Adams |
| 8,027,207 B2 | 9/2011 | Fifield et al. |
| 8,028,155 B1 | 9/2011 | Righi et al. |
| 8,077,520 B1 | 12/2011 | Yang et al. |
| 8,095,851 B2 | 1/2012 | Diggs et al. |
| 8,127,167 B2 | 2/2012 | Wang et al. |
| 8,150,801 B2 | 4/2012 | Srivastava et al. |
| 8,159,869 B2 | 4/2012 | Park et al. |
| 8,199,603 B2 | 6/2012 | Chung et al. |

(Continued)

*Primary Examiner* — Jeffrey Zweizig
(74) *Attorney, Agent, or Firm* — Hall Estill Attorneys at Law

(57) ABSTRACT

Apparatus and method for supplying electrical power to a device. A system on chip (SOC) integrated circuit includes a first region having a processing core and a second region characterized as an always on domain (AOD) power island electrically isolated from the first region and having a power control block. A first power supply module is used to apply power to the first region, and a second power supply module is used to apply power to the second region. The second power supply module includes a main switch between the first power supply module and a host input voltage terminal. The power control block initiates a low power mode by transitioning the main switch to an open state. This causes the first region to receive no electrical power while the second region continuously receives power during the low power mode.

20 Claims, 4 Drawing Sheets

(56) References Cited

U.S. PATENT DOCUMENTS

| | | |
|---|---|---|
| 8,258,844 B2 | 9/2012 | Elrod et al. |
| 8,291,251 B2 | 10/2012 | Rausehmayer et al. |
| 8,378,741 B2 * | 2/2013 | Hoshi et al. .................. 327/544 |
| 8,421,527 B2 * | 4/2013 | Sasaki et al. .................. 327/544 |
| 8,533,528 B2 * | 9/2013 | Maciorowski .................. 714/14 |
| 2003/0172135 A1 | 9/2003 | Bobick et al. |
| 2008/0098244 A1 | 4/2008 | Clinton et al. |
| 2008/0155331 A1 | 6/2008 | Rothman et al. |
| 2008/0162079 A1 | 7/2008 | Astigarraga et al. |
| 2010/0023870 A1 | 1/2010 | Baker |
| 2010/0027327 A1 | 2/2010 | Chung et al. |
| 2011/0075473 A1 | 3/2011 | Park et al. |
| 2011/0188292 A1 | 8/2011 | Joo et al. |
| 2012/0072639 A1 | 3/2012 | Goss et al. |
| 2012/0151162 A1 | 6/2012 | Trantham et al. |
| 2012/0221576 A1 | 8/2012 | Marquardt et al. |
| 2012/0260159 A1 | 10/2012 | Lazier et al. |
| 2012/0284230 A1 | 11/2012 | Adkins et al. |

* cited by examiner

INTEGRATED ALWAYS ON POWER ISLAND FOR LOW POWER MODE OPERATION

SUMMARY

Various embodiments of the present disclosure are generally directed to a method and apparatus for supplying electrical power to a circuit.

In accordance with some embodiments, a system on chip (SOC) integrated circuit is provided with a first region having a processing core and a second region characterized as an always on domain (AOD) power island. The second region is electrically isolated from the first region and includes a power control block.

A first power supply module is used to apply power to the first region, and a second power supply module is used to apply power to the second region. The second power supply module includes a main switch between the first power supply module and a host input voltage terminal.

The power control block initiates a low power mode by transitioning the main switch to an open state, so that the first region receives no electrical power and the second region continuously receives power during the low power mode.

These and other features and aspects which characterize various embodiments of the present disclosure can be understood in view of the following detailed discussion and the accompanying drawings.

DETAILED DESCRIPTION

Figure 1:
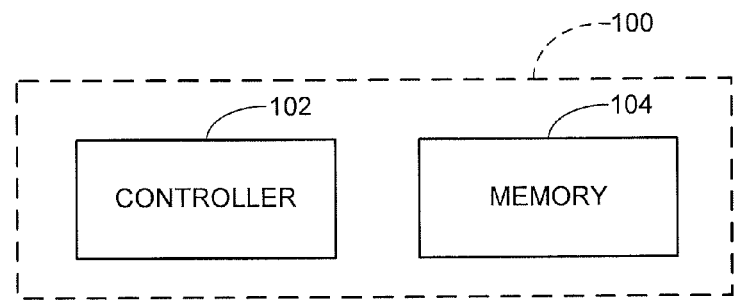
FIG. 1 is a functional representation of a data storage device.

The present disclosure generally relates to power management in an electronic device, and more particularly to a novel "always on" power island configuration to support a low power mode of operation for the device.

It can be highly desirable in electronic devices to achieve significant power consumption reductions by placing the devices in a reduced power mode. So-called low power mode (LPM) generally refers to a power state in which power consumption is held at a very low level, but the device is still able to decode a communicated signal to resume operation. Conceptually, LPM may be thought of as a power state that is just above a completely powered off state.

A challenge with implementing LPM schemes is the fact that many circuits leak when power is applied, particularly in complex circuits such as application specific integrated circuits (ASICs), field programmable gate arrays (FPGAs), etc. These and other types of complex circuits, all of which will generally be referred to herein as systems on a chip ("SOC"), can have millions of transistors and other active and passive elements. It can be difficult to reduce power in such devices while continuing to supply voltage due to the myriad opportunities for leakage paths through the circuitry.

Achieving LPM operation in a data storage device can be particularly difficult. Data storage devices, such as hard disc drives (HDDs) or solid state drives (SSDs), often utilize an SOC integrated circuit that operates as a storage controller. Such controllers require power to be applied to significant portions of the circuitry even during low power modes of operation. This is because there is no capability in the SOC architecture to restore power once the SOC itself is powered off. Some SOC functionality is thus required to enable the system to detect a wakeup command and resume normal operation.

External control circuitry, such as an external microcontroller, can be used to reawaken the main SOC, but this type of solution generally requires additional hardware which tends to adds cost, components, complexity and space. Many current generation LPM designs leave the SOC energized and attempt to optimize power consumption around this paradigm.

Other limitations that can be associated with current generation LPM designs include the requirement for multiple power-management interfaces (e.g. I2C/SIF, multiple GPIO signals, etc.) to control power for the system, which can result in multiple modes and duplicated functionality. Multiple interfaces increase the firmware (FW) and system management differences that need to be accommodated. Other limitations include the fact that voltage regulators are often not individually programmable and therefore cannot always be individually disabled. Serial interface (SIF) control systems generally need to remain powered at all times, which further tends to increase power consumption levels of a device.

Various embodiments of the present disclosure are generally directed to an apparatus and method for operating a device, such as but not limited to a data storage device, in a low power mode (LPM). As explained below, some embodiments utilize an SOC having an always on domain (AOD) power island. The AOD is formed of a small number of low-leakage transistors and logic elements on the SOC die.

A cooperative interface to the power electronics is connected to the SOC and communicates with the AOD. The interface includes an LPM module with a main power switch which, when opened, powers down remaining portions of the SOC and, as required, other aspects of the overall device.

The AOD and the LPM module are continuously powered from an external source, such as an input host power terminal. The AOD includes a power control block configured to monitor for one or more types of wake up signals during a LPM period. In response to a detected wake up signal, the power control block closes the main switch, returning power to the SOC. The SOC thereafter operates to resume operation of the device in an appropriate power mode.

In some embodiments, state data are maintained in a volatile memory during the LPM period for use once the device resumes higher power mode operation. A voltage sense circuit can monitor the supplied host power level during the LPM period. If a voltage fault is sensed, the power control block can signal the SOC that the data in the volatile memory may be compromised, allowing the SOC to operate accordingly (e.g., initiate a cold boot rather than a warm boot, etc.).

These and other features and advantages of various embodiments can be understood beginning with a review of FIG. 1 which provides a simplified functional representation of a data storage device 100. The device 100 includes a controller 102 and a mass storage memory 104. The controller 102 can take a variety of forms such as a system on a chip (SOC) with programmable processing capabilities using firmware stored in a suitable memory location.

The memory 104 can take a variety of forms and can be used to store user data from a host device (not separately shown). The functionality of the controller 102 and the memory 104 can be incorporated into a single chip, or distributed among different integrated circuit devices and other components (e.g., solid state memory, rotatable magnetic memory, mixtures of various types, etc).

Figure 2:
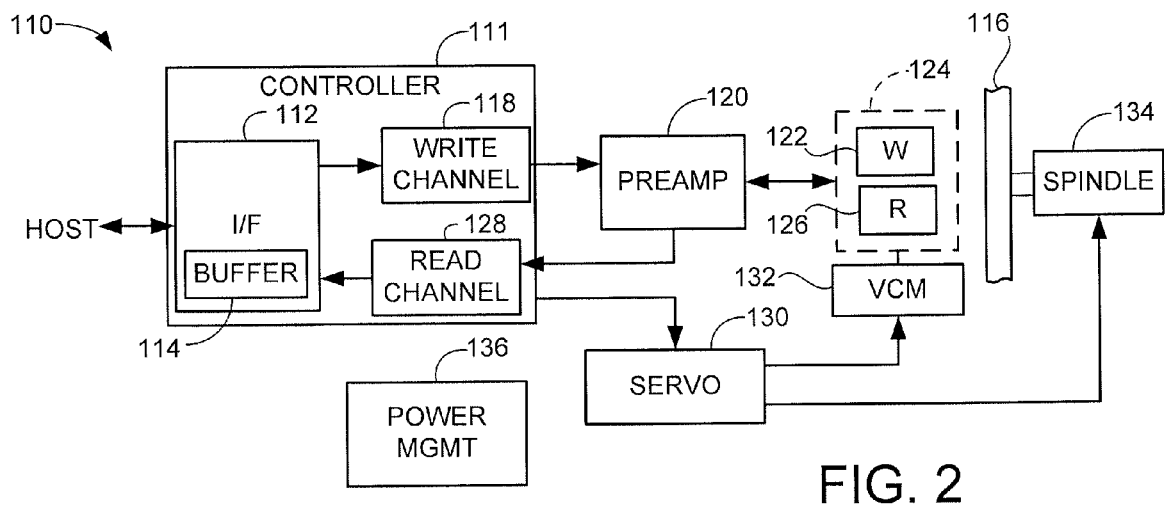
FIG. 2 is a functional representation of another data storage device.

FIG. 2 is a functional block diagram for a data storage device 110 that corresponds to the device 100 of FIG. 1 in some embodiments. The data storage device 110 is characterized for purposes of the present disclosure as a hard disc drive (HDD) that employs perpendicular magnetic recording heads and media to store data to one or more rotatable magnetic recording discs.

The device 110 in FIG. 2 includes a top level controller (SOC) 111. An interface circuit (I/F) 112 communicates with the host device and includes a data buffer 114 to temporarily store data pending transfer between the host device and a rotatable perpendicular data recording medium 116. In many embodiments the data buffer 114 is external to controller 111, such as when an external DRAM is used.

A write channel 118 operates to encode input write data from the host to provide a serialized data stream to a preamplifier/driver (preamp) 120. The preamp 120 provides a sequence of write currents to a perpendicular magnetic write element (W) 122 of a data transducer 124 to write data to the medium 116.

During a readback operation, readback signals are transduced by a magneto-resistive (MR) read element (R) 126 of the data transducer 124. The transduced signals are supplied to the preamp 120. The preamp 120 conditions and amplifies the readback signals and provides the same to a read channel 128. The read channel 128 applies signal processing techniques to recover the originally stored data to the buffer 114 pending subsequent transfer to the host.

During both read and write operations, specially configured servo positioning data on the medium 116 are transduced by the read element 126 and, after demodulation by a portion of the read channel 128, are supplied to a servo control circuit 130. The servo control circuit 130 provides positional control signals to a voice coil motor (VCM) 132 coupled to the data transducer 124 to position the respective write and read elements 122, 126 adjacent various data tracks defined on the medium 116.

The servo control circuit 130 further provides control inputs to a spindle motor 134 which rotates the medium 116 during operation. To avoid damage to the device 110, the servo circuit 130 moves the transducer(s) 124 to a safe parking position, such as on a ramp structure or a landing zone, prior to deactivation of the spindle motor 134.

FIG. 2 further depicts a power management circuit 136. The power management circuit 136 operates to supply electrical power to the various constituent elements of the device. While shown as a separate functional block, portions of the power management circuit 136 may be physically incorporated into other blocks of FIG. 2, such as in the controller 111. The construction and operation of the power management circuit 136 in accordance with various embodiments will be discussed in greater detail below.

Figure 3:
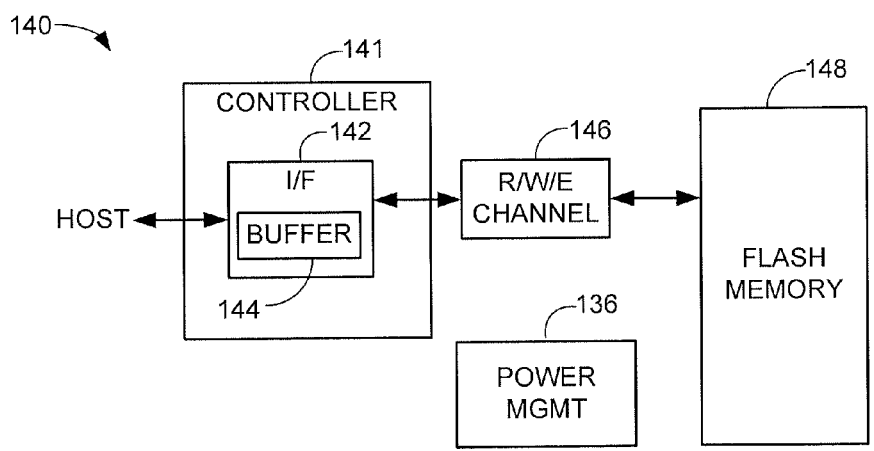
FIG. 3 is a functional representation of another data storage device.

FIG. 3 is a functional block diagram for another data storage device 140 that corresponds to the device 100 of FIG. 1 in some embodiments. The data storage device 140 is characterized as a solid state drive (SSD) that employs non-volatile flash memory to store data from the host device.

As with the HDD device 110 of FIG. 2, the SSD device 140 of FIG. 3 includes a top level controller (SOC) 141, including an I/F circuit 142 with a data buffer 144. A read/write/erase (R/W/E) channel 146 provides read, write and erasure capabilities for one or more flash memory arrays 148, although in some embodiments, the R/W/E channel is part of individual dies within the flash memory array 148. The SSD device 140 includes the aforementioned power management circuit 136 to selectively provide electrical power to the various constituent elements in the device.

It is contemplated that each of the storage devices of FIGS. 1-3 are adapted to operate in a variety of different power modes. These power modes can be arranged in a hierarchy from a lowest mode (deactivated or "off") to a highest mode (normally operating or "fully on"). Various intermediate power mode levels can be defined between these lowest and highest modes. The intermediate power mode levels represent reduced power mode levels of operation in which the device consumes less power than during normal operation.

The savings in power consumption provided by a reduced power mode is offset by an increased response time for the device to transition back and resume normal operation. Generally, the lower the power mode, the longer the device will need to be able to return to an operationally ready state and begin processing access commands from the host.

With regard to the HDD device 110 of FIG. 2, it can be seen that different elements may have different power consumption requirements. Successively lower power modes can be achieved by deactivating (turning off) different elements, or combinations of elements in the device. For example, one or more reduced power modes may be obtained by parking the transducer(s) 124, turning off associated circuits such as the read/write channels 118 and 128, the preamp 120 and the servo circuit 130, turning off the spindle motor 134, etc.

Similarly, the SSD device 140 in FIG. 3 can be transitioned to various reduced power modes by selectively deactivating different elements such as the R/W/E channel 146 and the flash memory 148. These reduced power levels are established by the respective power management circuits 136 and can be referred to by various labels such as a "standby mode," a "sleep mode," etc.

A low power mode (LPM) mode is additionally contemplated for the devices of FIGS. 1-3. As disclosed herein, LPM is just above being fully turned off in terms of power consumption, and is achieved by turning off substantially all of the functionality of the respective controllers 111, 141 and interface circuits 112, 142 as shown in FIGS. 2 and 3. It has been found in some cases that LPM power consumption levels of around 12.5 milliwatts, mW ($1.25 \times 10^{-6}$ W) or less are attainable using the systems disclosed herein.

Figure 4:
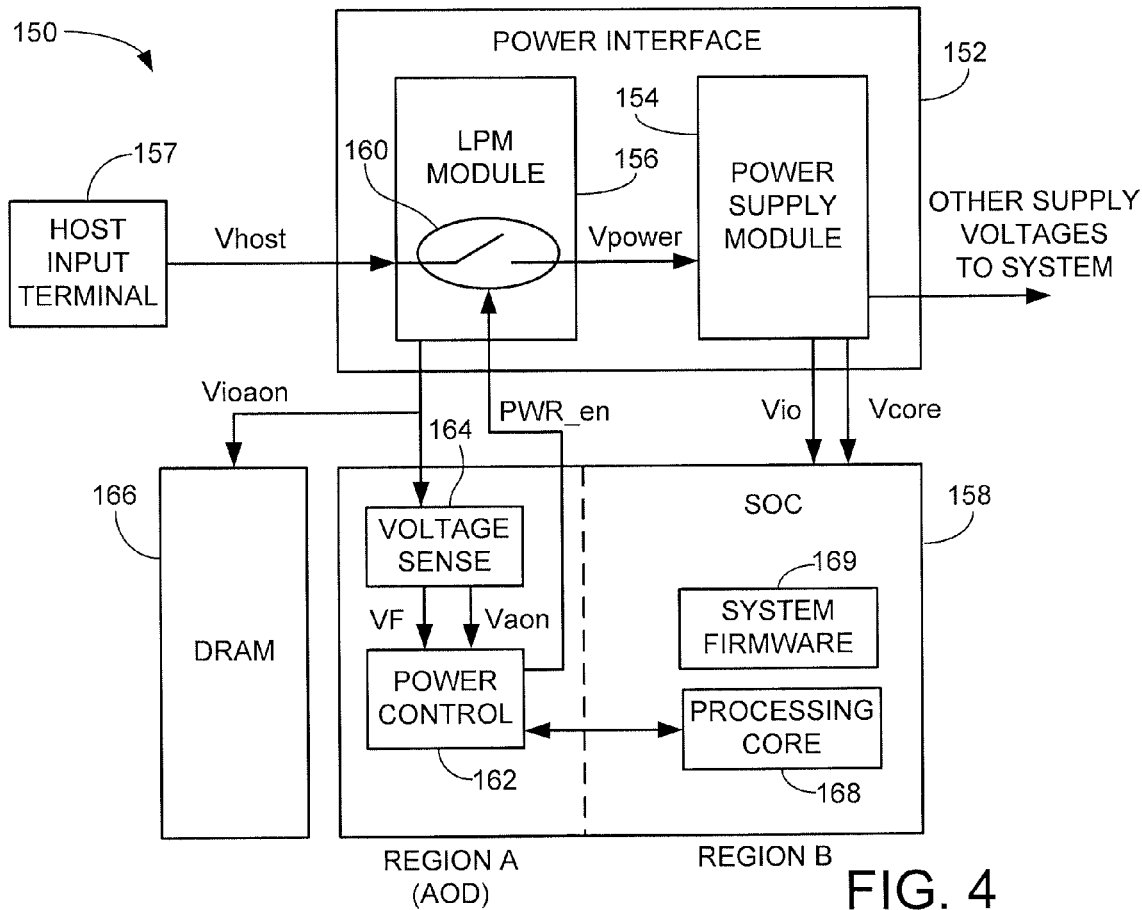
FIG. 4 depicts a power management circuit of the devices of FIGS. 1-3 in accordance with some embodiments of the present disclosure.

FIG. 4 is a functional block representation of relevant portions of a power management circuit 150 generally similar to the power management circuit 136 of FIGS. 2-3. While the circuit 150 can be adapted to supply power to the respective storage devices of FIGS. 1-3, the circuit can be used in other types of operational environments as well. The circuit 150 can be used to enact a variety of power modes for the associated device, including a fully powered mode, an off mode, at least one or more intermediate modes such as a sleep mode and a standby mode, and a low power mode.

The power management circuit 150 includes a power interface 152. The power interface 152 includes a main power supply module 154 and a low power mode (LPM) module 156. For reference, the main power supply module 154 will sometimes be referred to as a "first" power supply module, and the LPM module 156 will sometimes be referred to as a "second" power supply module. These respective modules 154, 156 may be separate components or may be integrated into a common semiconductor die.

The power interface 152 receives electrical power (e.g., voltage Vhost) from a host input terminal 157 associated with the host device. The interface uses this input host power to supply electrical power to other circuits and components, including a system on chip (SOC) 158. The voltage Vhost can be any suitable value, such as nominally +5V, +12V, etc. Multiple input host voltages can be concurrently supplied as desired.

The power supply module 154 incorporates a number of voltage regulators, logic and other elements to supply various supply (rail) voltages at various magnitudes. Both negative and positive voltages may be supplied. These various voltages are represented by voltage Vio which is a switchable data I/O voltage rail such as +12V, +5V, +3.3V, +2.5V, +1.8V, etc., and voltage Vcore which is a switchable core circuitry voltage rail such as +0.9V, etc.

In some embodiments, the LPM module 156 includes a power switch, represented at 160, which can take the form of a power transistor or other circuit element(s). The LPM module 156 receives the input host voltage Vhost and, when the switch 160 is closed, provides a corresponding voltage Vpower to the power supply module 154.

In an alternative embodiment, the functionality of power switch 160 can also be realized in the form of connecting the PWR_en signal to one or more "regulator enable" input signals on voltage regulators within power supply module 154. However, this configuration may provide less overall power savings than the previous embodiment of a switch disconnecting all of 154 from the host. Reference herein to a main switch will be understood to include both of these alternative configurations (e.g., a primary FET, one or more regulator control inputs, etc.).

The power management circuit 150 further includes an always on domain (AOD) power island, denoted generally as Region A in the SOC 158. The AOD includes a power control block 162 and a voltage sense circuit 164. The power control block 162 and the voltage sense circuit 164 are integrated into the circuitry of the SOC 158. More specifically, the power control block 162 and the voltage sense circuit 164 occupy a first region (Region A) of the SOC 158. The remainder of the SOC is identified as a second region (Region B).

Power for Region A is electrically isolated from power for Region B. For reference, Region B may take a variety of configurations including additional power islands (not separately shown), but generally, Region B will be contemplated as constituting the majority of the overall SOC, and Region A will be contemplated as constituting a relatively small portion of the overall SOC.

The LPM module supplies a voltage Vioaon to the voltage sense circuit 164, which in turn supplies a voltage Vaon to the power control block 162. The voltages Vioaon and Vaon represent rail voltages that are always on so long as the Vhost voltage continues to be supplied to the device. The voltages Vioaon and Vaon may have voltage magnitudes that corresponds to the Vio voltage magnitude, or may take some other suitable voltage levels.

In some cases, the voltage Vioaon is further supplied to other components, such as a volatile memory 166. The volatile memory 166 is characterized as a dynamic random access memory (DRAM) and may serve as a memory space available to the SOC. For example, the DRAM memory 166 may constitute the data buffers 114, 144 of FIGS. 2-3, or some other memory of the device (e.g. registers, SRAM, etc.).

The power control block 162 provides a power enable PWR_en signal to selectively open and close the switch 160 of the LPM module 156. The voltage sense circuit 164 monitors the voltage Vioaon and, as required, supplies a voltage fault (VF) signal to the power control block 162 indicating a voltage fault during the LPM period. For reference, the PWR_en signal may be considered a disable signal when transitioning the switch 160 to the open state, and a power enable signal when transitioning the switch to the closed state.

A processing core 168 of the SOC 158 is active during all modes of powered operation except for the low power mode. The processing core 168 may utilize system firmware 169, stored on-chip or elsewhere, to provide system control such as commands to initialize and operate the system, commands to the power interface 152 to selectively energize or turn off different aspects of the device to enact a reduced power mode level, and so on. The Region B portion of the SOC 158, including the processing core, is specifically deactivated and receives no electrical power during LPM periods. Region A of the SOC 158 (e.g., the power control block 162 and the voltage sense circuit 164) remains active during all modes including LPM periods.

As will be appreciated, the AOD (Region A) is a power island within the SOC 158. A power island can be understood as a region of logic in a circuit device that is electrically isolated from other regions of the circuit device in such a way that the power island can remain electrically energized while the rest of the circuit device is de-energized without damaging the circuit device, or undesirably corrupting the functionality of either region. The AOD is incorporated into the same semiconductor die as the rest of the SOC 158. When both regions are active, the power control block 162 can readily communicate with the processing core 168.

The LPM module 156 of FIG. 4 provides a cooperative interface between the SOC 158 and the power supply module 154 with a straightforward enable/disable control architecture. The power control block 162 has a simple construction with a relatively low complexity of control logic. As depicted in FIG. 4, the SOC 158 provides a single bit (PWR_en) to enact the LPM operation. Multibit configurations are contemplated, such as mask bits to define different regulator states for different operational levels. The power control block 162 is always on to monitor for external inputs to wake up from the LPM by asserting the PWR_en signal or other input to the LPM module 156.

As will be appreciated, controlling the reset/power-on sequence can be an important consideration in designing a power system for a device. In the example of FIG. 4, the control signal from the power control block 162 is implemented using a tri-stateable I/O cell. The cell defaults to a tri-stated (no driving of the signal) mode at reset/power on. The power control block 162 powers on the rest of the system via the switch 160, and is generally designed to "fail on" so that, responsive to various inputs, the block automatically restores power to the rest of the system.

Figure 5:
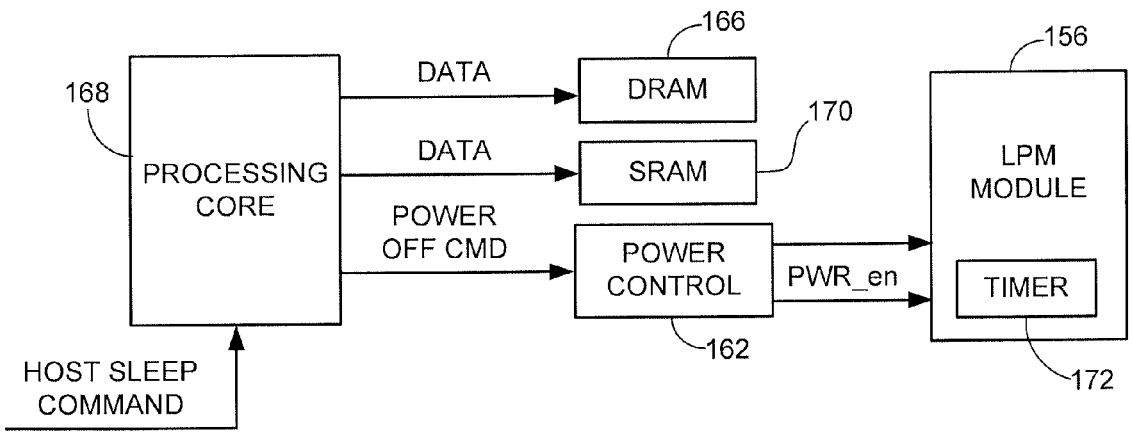
FIG. 5 illustrates transition to low power mode by the circuitry of FIG. 4.

FIG. 5 is a functional block representation of steps that can be carried out during a transition from a normal power mode to the low power mode (LPM). Once the device is powered up and enters normal operational mode (e.g., the highest power mode level) the host device may request entry into a reduced power mode, such as a sleep mode. The request may come via a data I/O pin, an indication on a host serial phy (physical layer) interface, or by some other host communication signal. The power control block 162 proceeds to shut off the surrounding logic using the PWR_en signal to open the switch 160. This causes the system to enter the low power mode (LPM), and the power control block 162 monitors for a wake up signal.

In some cases, system state information may be maintained during the LPM and stored in the DRAM volatile memory 166. The DRAM can be placed into a self-refresh mode prior to shutdown and can maintain this state using the input Vioaon voltage. The processing core 168 can operate to select and load the system state information to the DRAM prior to shutdown.

In another embodiment, the power control block 162 may incorporate internal volatile SRAM (static random access memory) 170 that can be used to store these and/or other forms of data during the LPM period. An advantage of this latter approach is that the SRAM 170 is internal to the SOC 158 and is therefore not easily accessed. The use of volatile memory during the LPM period provides a security feature that, should power be lost or otherwise fluctuate, the contents may not be retained and/or recoverable. The data may additionally, or alternatively, be stored in non-volatile memory either incorporated into the SOC 158 or external non-volatile memory devices (not separately shown).

Once the processing core 168 has completed the pre-shutdown processing, the processing core can provide a power off command control signal to the power control block 162. An arming signal (not separately depicted in the drawings) can be used to prepare the system for LPM entry, and the system actually enters LPM via the PWR_en signal transitioning the switch 160 to the open state. A timer circuit 172 may remain powered within the LPM module 156 (or in the power control block 162) and initiate an elapsed time measurement to measure the duration of the LPM period. In some cases, the LPM period may expire after a selected interval of elapsed time.

Figure 6:
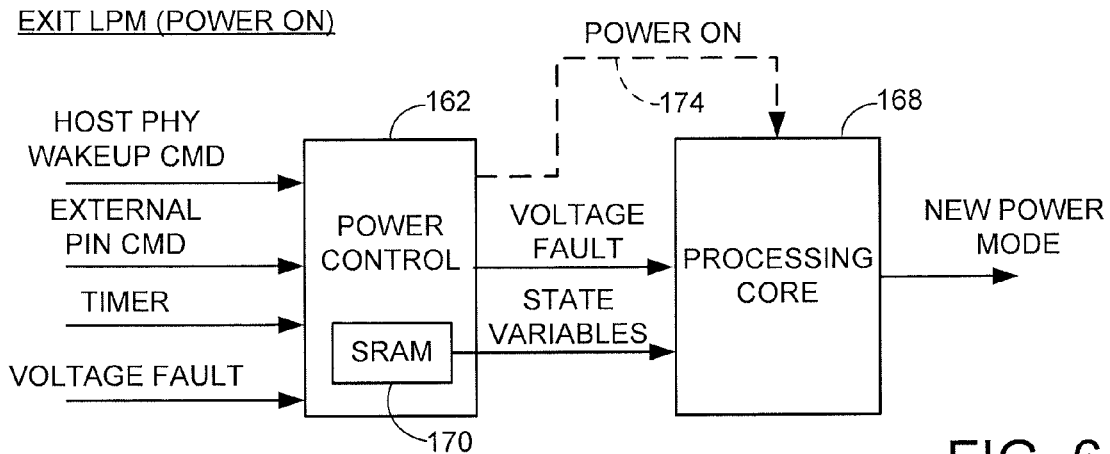
FIG. 6 illustrates transition from low power mode back to normal operation by the circuitry of FIG. 4.

FIG. 6 generally represents various operations of the circuitry of FIG. 4 during the LPM period and as the circuitry exits from the LPM period and resumes a higher power mode of operation. During the LPM period, the power control block 162 monitors for a wake up indication. The indication can be provided in a number of ways, and the power control block 162 can concurrently monitor for a number of different indications from different sources.

As shown in FIG. 6, in some cases the host device may send a wake up command to specifically request that the device wake up and return to normal operation. The wake up command may be sent via a host phy (physical interface layer) signal or an external pin command. A separate sideband signal can be provided from the host using a dedicated conduit (wire) connected to the device to provide the wake up command. Additionally or alternatively, a timer signal such as from the timer 172 may signal a resumption of higher mode activity after a selected period of time has been completed.

The power control block 162 monitors for the occurrence of one or more voltage fault (VF) indications from the voltage sense circuit 164. The voltage sense circuit 164 is formed from low leakage components and can include regulators and sensing logic to detect variations, if any, in the Vioaon voltage level. A voltage fault may be declared if the voltage sense circuit 164 detects a change in the Vioaon voltage sufficient to potentially corrupt the data in the DRAM 166 (or SRAM 170). In some cases, the occurrence of a voltage fault may serve as a wake up signal to the power control block 162. In this way, the power control block 162 operates to "fail on"; that is, immediately turn on the system responsive to a voltage fault.

During a wake up event, the power control block 162 closes switch 160, thereby energizing at least the SOC 158 and transferring system control to the processing core 168. This is represented by the power on path 174 in FIG. 6. The power control block 162 may communicate other information to the core 168 at this time, such as the indication of a voltage fault event, the transfer of state variables that were stored immediately prior to the LPM period, and so on.

The processing core 168 thereafter assumes control and commands a new power mode for the device. A boot operation may be carried out, for example, to reboot the system and resume normal operation. The boot type state, such as a cold boot (entire reinitialization from scratch) or a warm boot (using stored parameters or other state variables) can be held by the power control block 162 and provided to the processing core 168. The location of the storage of the variables and other data can be selected as desired. Internal storage of such within the AOD provides an additional security feature in that there is no external or cross-device communication points on which to insert a monitor to learn information or intercept the signaled data.

Power mode cycling operations by the circuitry of FIGS. 4-6 can be briefly summarized as follows: power is applied to the device; the Vaon voltage regulator (within the voltage sense circuit 164) is activated; a reset event is asserted and released to the power control block 162; the power control block 162 turns on the voltage regulators, asserts the same, and then releases a reset to the rest of the device; the main SOC 158 boots up via the processing core 168; and the processing core 168 interrogates the power control block 162 to determine whether a warm boot or a cold boot should be used. If a cold boot (reset) is selected, a normal power on initialization process is carried out. If a warm boot (reset) is selected, state data is loaded and the system resumes normal operation.

Thereafter, a power savings mode may be initiated, such as by a host command or an internal timer. Steps to initiate the power savings mode include: the saving of state information by the device, such as in the DRAM 166 or SRAM 170; the power control block 162 engages isolation and powers off the rest of the system; the power control block 162 monitors for a subsequent wake up indication and detected voltage faults; upon receiving such, the power control block 162 once again reasserts power to the system and communicates to the processing core 168 to enable resumption of an appropriate power mode. It will be noted that an external single pin reset coupled to the power system and the SOC can be carried out in parallel.

Figure 7:
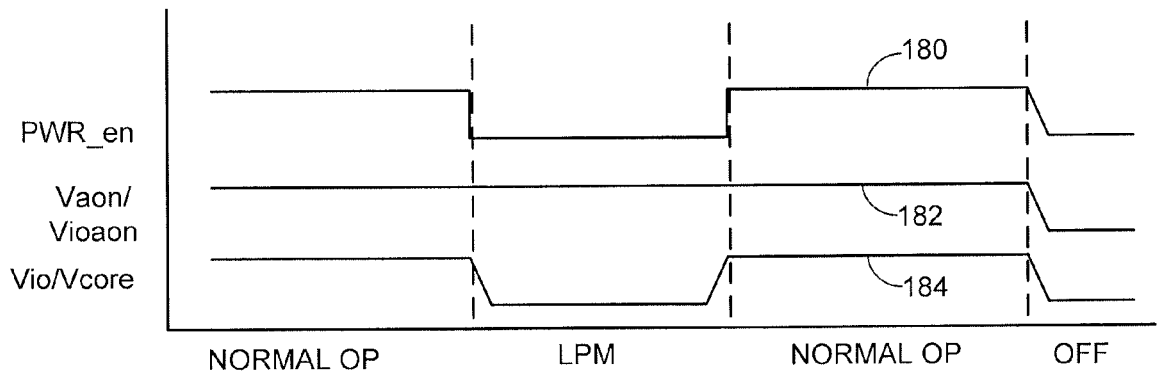
FIG. 7 is a timing diagram for various signals generated by the circuitry of FIG. 4.

FIG. 7 is a timing diagram to illustrate various signals discussed above as the circuitry of FIGS. 4-6 transitions between various modes including normal operation, LPM and off. The PWR_en signal, represented by waveform 180, is asserted high during normal operations and asserted low during LPM.

The always on voltages Vaon and Vioaon (waveform 182) maintain a steady state level during both normal operation and LPM and are only deasserted when the device is turned off. By contrast, the switchable voltages Vio and Viocore (waveform 184) are asserted during normal operation but are deasserted during both LPM and when the device is off.

Figure 8:
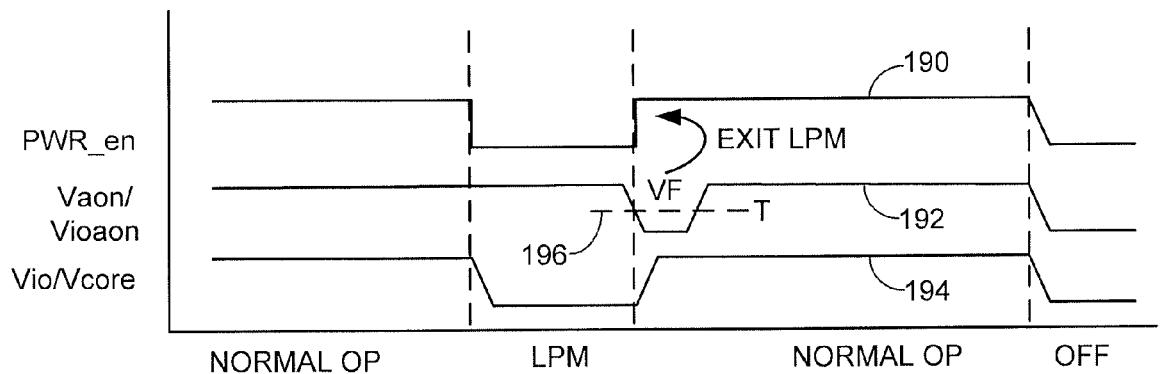
FIG. 8 is another timing diagram for various signals generated by the circuitry of FIG. 4.

FIG. 8 is a corresponding diagram to represent operation of the system in the presence of a voltage fault during the LPM period. Waveforms 190-194 generally correspond to the waveforms 180-184 of FIG. 7.

As can be seen, a voltage loss of the normally "always on" voltages Vioaon and Vaon during the LPM period causes an immediate exit of the LPM and resumption of normal operation. A voltage threshold 196 can be used to detect the voltage fault. Other voltage thresholds can be used as well, including overvoltage thresholds. Exiting the LPM period due to a voltage fault results in a loss of warm boot state, and the processing core 168 initiates a cold reset when normal operation is resumed.

The various aspects of the power management circuit 150 (FIG. 4) can be realized using low power loss components (e.g. low-leakage transistors). The main switch 160 can be implemented using one or more field effect transistors (FETs) or other low leakage devices. Other aspects of the LPM module 156, the power control block 162 and the voltage sense circuit 164 can be formed from low drop out (LDO) regulators, low loss gate logic, FETs, etc.

It will be appreciated that many electronic devices use DC-DC switching regulators. These devices often employ inductors and/or capacitors to reduce the voltage from one level to another. Low drop out (LDO) regulators, by contrast, use active transistors to reduce voltage levels, and dissipate the drop in voltage as heat. It has been found that, at very low current levels, LDO regulators can be as efficient as switching regulators because the need for power oscillators and switching support logic can be eliminated. LDO regulators can also be formed within an ASIC. Accordingly, in at least some embodiments the voltage regulation aspects of the circuitry active during the LPM periods, such as the voltage sense circuit 164, are formed using LDO regulators.

Figure 9:
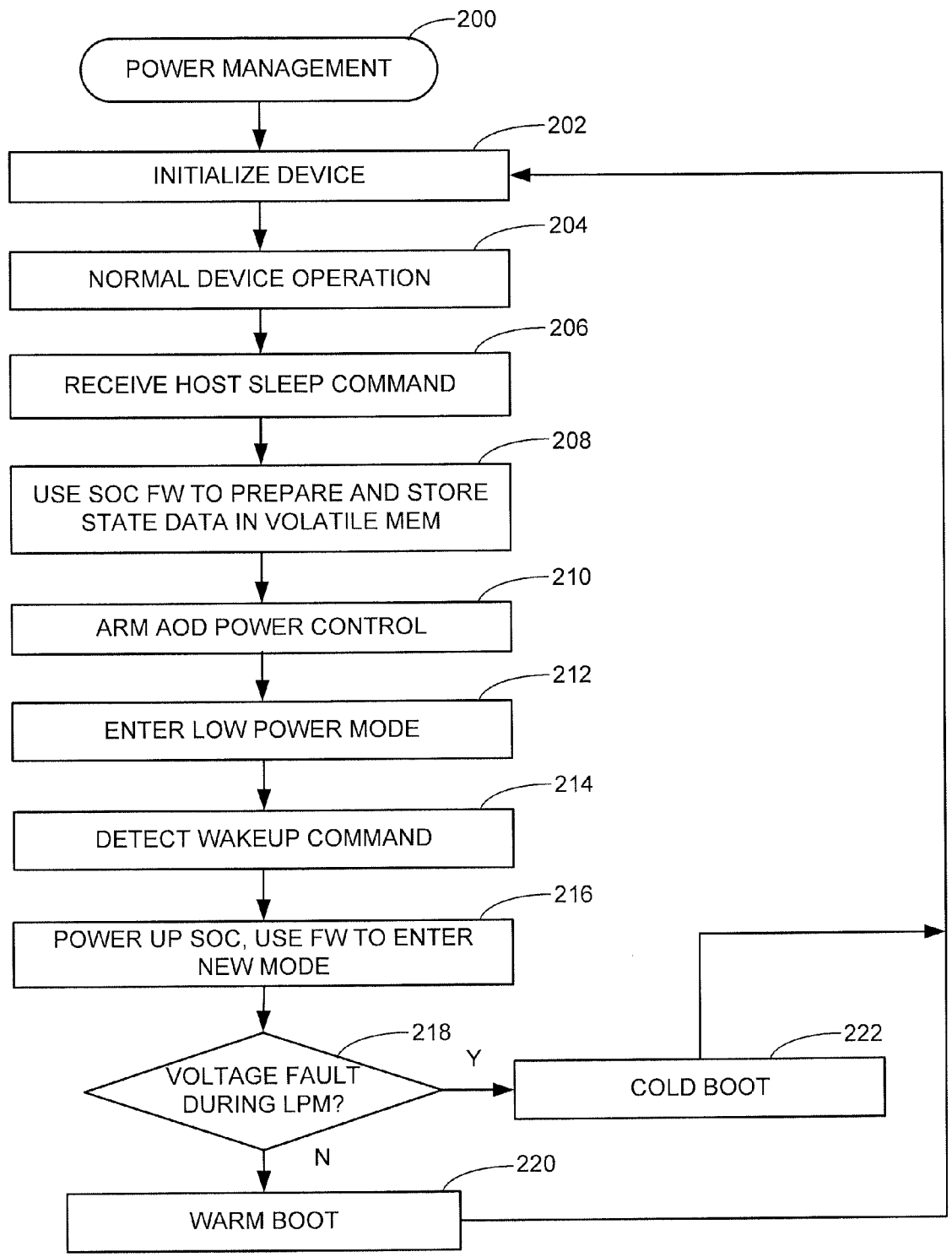
FIG. 9 is a flow chart for a power management routine.

FIG. 9 is a flow chart for a power management routine 200 to illustrate aspects of the foregoing discussion. It will be appreciated that the flow chart is merely for purposes of illustrating a particular example and is not limiting. Various steps can be modified, omitted and/or added as required by a given application. For purposes of the present discussion, it will be contemplated that the routine is carried out by the circuitry of FIGS. 4-6 as embodied in the storage device 110 of FIG. 2. Other environments can be readily used.

At step 202, the storage device 110 is initialized from a powered off state. This involves a number of steps including a cold boot sequence, initiation of rotation of the medium 116, advancement of the transducer 124 to an operationally ready position, initialization of the various read/write channels 118, 128, the servo circuit 130, the preamp 120, etc. Other initialization paths can alternatively be used.

The initialization of step 202 places the device in a normal device operational mode at step 204. During this mode, the device 110 is fully powered and active in servicing host access (e.g., read and write commands). The commands result in the transfer and storage of data to and from the medium 116.

A host sleep command is next received at step 206. As discussed above, the sleep command is a request by the host device for the device 110 to enter a lower power mode, thereby reducing the level of power consumption. Responsive to the sleep command, the device controller 111 (SOC), by way of the associated firmware (e.g., 168 in FIG. 4), prepares for entry into low power mode (LPM) at step 208. This may include the preparation and storage of state data in a volatile memory (e.g., DRAM 166 or SRAM 170) and/or a non-volatile memory (e.g., NOR flash, NAND flash, etc).

The power control block 162 is next armed at step 210 by system firmware. This prepares the system to enter LPM, which occurs at step 212 by the subsequent assertion of the PWR_en signal. A wake up indication signal is thereafter detected by the power control block 162 at step 214, and this results in the powering up of the controller 111 (SOC) at step 216.

Decision step 218 determines whether a voltage fault was detected during the LPM period. If not, a warm boot (reset) process may be carried out at step 220 to restore the state data stored during the LPM period. If a voltage fault was detected, a cold boot (reset) process is alternatively carried out at step 222 so that the stored state data are jettisoned and not used. Normal operation is thereafter resumed at step 204.

From the foregoing discussion it can be seen that the various embodiments disclosed herein can provide a number of benefits. Power consumption levels in the disclosed LPM may be significantly lower than other previously achievable levels. In some cases, power consumption of a hard disc drive (HDD) configured as disclosed herein has been found to be reduced to a range of about 12.5 mW, which is about an order of magnitude less than what was otherwise achievable by maintaining the SOC in a lowered state (e.g., about 10 mW v. 100 mW or more).

The system as disclosed also provides enhanced reliability, in that requests to power down the system can be ignored if a voltage fault condition is present or has been detected. The system firmware is in charge of determining exactly when LPM is entered, and so the firmware can defer entry until safe entry can be achieved. The status of the low power mode can be reported to the system as it wakes up, allowing the system to take an appropriate reset approach (e.g., cold or warm reboot, etc.).

It is to be understood that even though numerous characteristics and advantages of various embodiments of the present disclosure have been set forth in the foregoing description, together with details of the structure and function of various embodiments of the disclosure, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
a system on chip (SOC) integrated circuit comprising a first region having a processing core and a second region comprising an always on domain power island with a power control block, the second region electrically isolated from the first region;
a first power supply module adapted to apply power to the first region; and
a second power supply module adapted to supply power to the second region, the second power supply module comprising a main switch between the first power supply module and a host input power terminal, wherein the power control block initiates a low power mode by transitioning the main switch to an open state so that the first region receives no electrical power and the second region continuously receives power during said low power mode.

2. The apparatus of claim 1, in which the first and second power supply modules respectively generate first supply power and second supply power responsive to an input host supply power from the input host supply terminal, and wherein input host supply power from the host input power terminal is not supplied to the first power supply module responsive to the main switch being transitioned to said open state.

3. The apparatus of claim 1, in which the power control block transitions the main switch to an open state by transmitting a power disable signal to the second power supply module responsive to a control signal transmitted to the power control block from the processing core.

4. The apparatus of claim 3, in which the power control block subsequently transitions the main switch to a closed state by transmitting a power enable signal to the second power supply module responsive to detection by the power control block of a wake up indication signal.

5. The apparatus of claim 1, further comprising a volatile memory which stores state data associated with the first portion of the SOC, wherein the second power supply module continuously applies power to the volatile memory during the low power mode.

6. The apparatus of claim 1, in which the second region of the SOC further comprises a voltage sense circuit which monitors a voltage level of the power applied to the second region during the low power mode and transmits a voltage fault signal to the power control block responsive to a magnitude of the monitored voltage level and a predetermined threshold.

7. The apparatus of claim 6, in which the processing core, the power control block and the voltage sense circuit are each formed of a respective plurality of transistors incorporated into the SOC.

8. The apparatus of claim 1, in which the processing core operates to, responsive to detection of a sleep command issued by a host device, store state data associated with the first region in a volatile memory and/or a non-volatile memory and provide a command signal to the power control block to initiate the low power mode.

9. The apparatus of claim 8, in which the volatile memory is in the second region of the SOC and continuously receives power during the low power mode.

10. The apparatus of claim 1, in which the power control block subsequently transitions the main switch to a closed position to resume application of power to the first region at a conclusion of the low power mode, in which the power control block transmits a status indication to the processing core indicative of a presence or an absence of a fault condition detected during the low power mode, and in which the processing core initiates a cold boot reinitialization or a warm boot reinitialization responsive to the status indication from the power control block.

11. The apparatus of claim 1, in which the SOC is characterized as a storage controller of a data storage device, and the apparatus further comprises a memory adapted to store data from a host device responsive to control inputs provided by the storage controller.

12. A method comprising:
connecting a system on chip (SOC) integrated circuit to a power interface, the SOC comprising a first region having a processing core and a second region electrically isolated from the first region as an always on domain power island having a power control block, the power interface comprising a first power supply module adapted to apply power to the first region and a second power supply module adapted to supply power to the second region, the second power supply module comprising a main switch between the first power supply module and a host input voltage terminal; and
placing the SOC and the power interface into a low power mode by transitioning the main switch from a closed state to an open state so that the first region receives no electrical power and the second region continuously receives power during said low power mode.

13. The method of claim 12, further comprising subsequently transitioning the SOC and the power interface to a fully powered state by returning the main switch to the closed state, thereby resuming application of power to the first region of the SOC.

14. The method of claim 13, in which the subsequently transitioning step comprises using the processing core to execute a boot process to return to an operationally ready state.

15. The method of claim 12, in which the placing step comprises transmitting a control signal from the processing core to the power control block and, in response thereto, transmitting a power disable signal from the power control block to the second power supply module.

16. The method of claim 15, in which the control signal is transmitted responsive to a sleep command received from a host device.

17. The method of claim 12, in which the placing step further comprises storing state data associated with the first region of the SOC in a volatile memory prior to removal of power from the first region, and continuously supplying power to the volatile memory during the low power mode.

18. The method of claim 17, in which the volatile memory is located within the second region of the SOC.

19. The method of claim 12, further comprising monitoring a magnitude of a voltage applied to the second region during the low power mode and providing a voltage fault indication to the power control block responsive to the magnitude of the second supply voltage during the low power mode.

20. The method of claim 19, further comprising transmitting the voltage fault indication from the power control block to the processing core at a conclusion of the low power mode.

* * * * *